United States Patent

Atwater et al.

[11] Patent Number: 6,063,707
[45] Date of Patent: May 16, 2000

[54] SELECTIVE PVD GROWTH OF COPPER ON PATTERNED STRUCTURES BY SELECTIVELY RESPUTTERING AND SPUTTERING AREAS OF A SUBSTRATE

[75] Inventors: Harry A. Atwater, Pasadena; Donald S. Gardner, Mountain View, both of Calif.

[73] Assignees: California Institute of Technology, Pasadena; Intel Corporation, Santa Clara, both of Calif.

[21] Appl. No.: 08/730,038

[22] Filed: Oct. 11, 1996

[51] Int. Cl.[7] .................................................. H01L 21/44
[52] U.S. Cl. .......................... 438/687; 438/645; 438/675; 438/674; 438/688
[58] Field of Search .................................... 437/190, 192, 437/195; 438/652, 688, 672, 64.5, 67.4, 67.5, 68.7

[56] References Cited

U.S. PATENT DOCUMENTS 5,434,104  7/1995  Cain et al. ............................. 437/198

*Primary Examiner*—Charles Bowers
*Assistant Examiner*—Reneé R. Berry
*Attorney, Agent, or Firm*—Fish & Richardson P.C.

[57] ABSTRACT

Features, e.g., vias or lines, are formed of copper by using selective PVD growth. A patterned structure is formed having a underlayer of a material that will accumulate copper by sputtering. An overlayer resputters the copper so that it does not accumulate a layer of copper. Copper is resputtered onto the underlayer using a sputtering ion that has a higher molecular weight than the copper. Copper is used to fill the gap defining the desired feature, and to cover an overlayer. Polishing and etchback are then used to remove the resputtered thin material and remove all of the copper on the upper surface, leaving the copper feature.

13 Claims, 2 Drawing Sheets

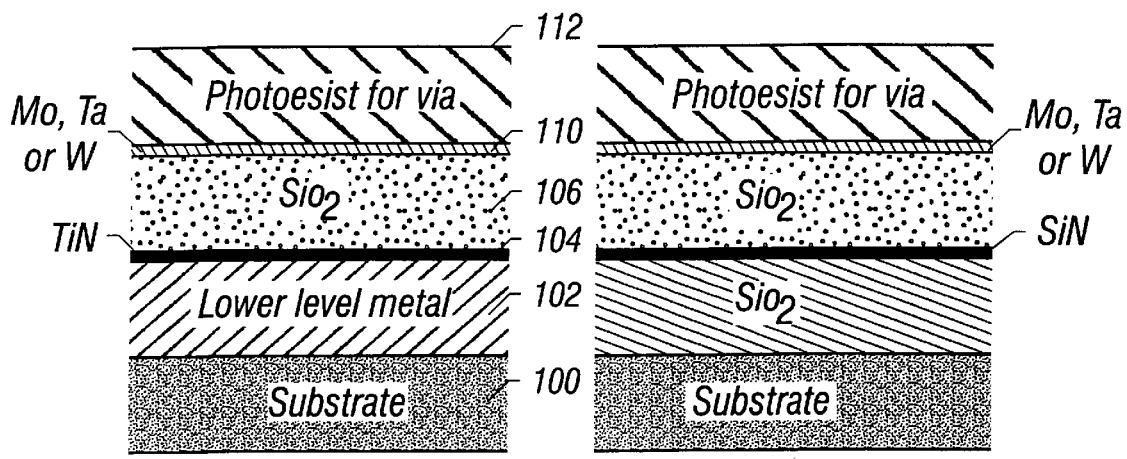
FIG. 1A
FIG. 2A
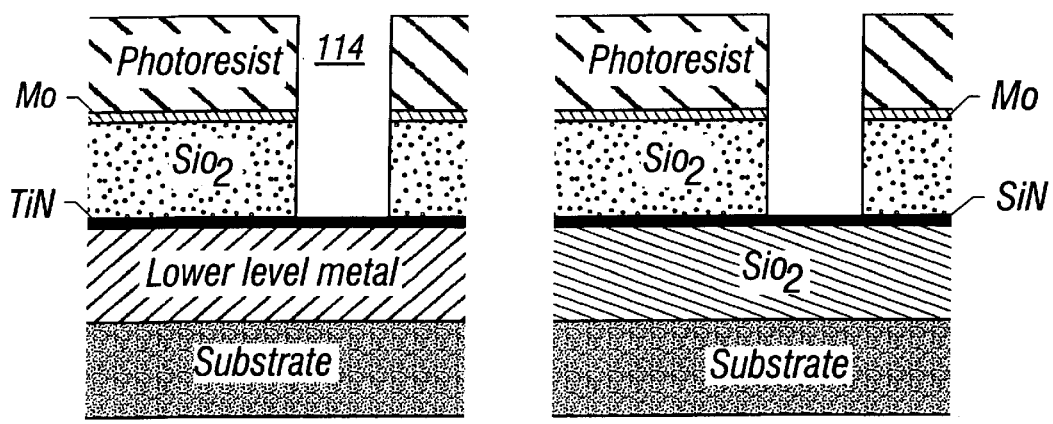
FIG. 1B
FIG. 2B
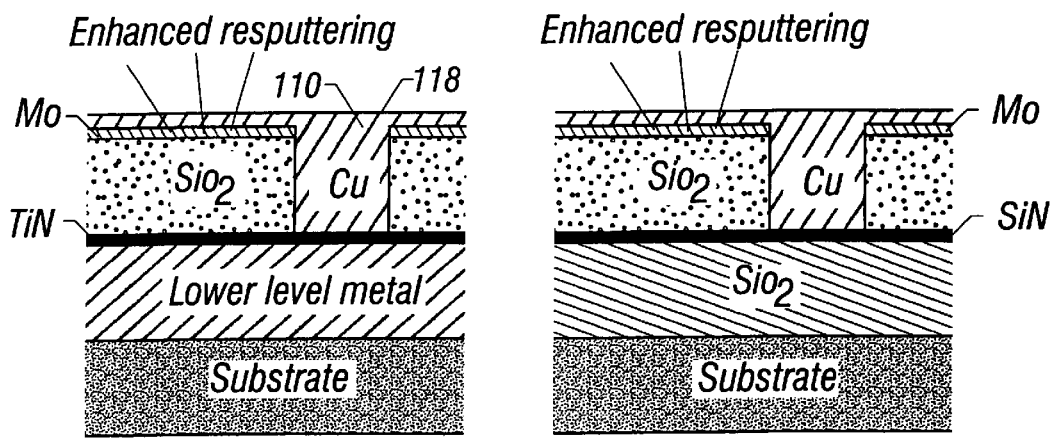
FIG. 1C
FIG. 2C

SELECTIVE PVD GROWTH OF COPPER ON PATTERNED STRUCTURES BY SELECTIVELY RESPUTTERING AND SPUTTERING AREAS OF A SUBSTRATE

FIELD OF THE INVENTION

The present invention teaches a technique of selective deposition using a special technique including both sputtering and resputtering. More specially, the present invention teaches sputtering copper into features, e.g. vias between interconnecting lines, to build up a copper layer, and resputtering at areas other than the vias so that no copper layer is built at those areas.

BACKGROUND AND SUMMARY

Interconnections between different parts of an integrated circuit increasingly affect the performance, reliability and power consumption of the integrated circuit. The geometry and characteristics of these interconnections are an important characterization of the operation of the resulting semiconductor. One structure which interconnects the different levels of interconnections is called a via. Vias have been traditionally made of aluminum wiring materials.

There is a demand in the art for smaller sized vias. This demand has led the present inventors to consider copper for use in forming the vias. Copper has a lower resistivity and higher reliability than previously-used materials such as aluminum.

These materials have been traditionally deposited by a deposition technique. One difficulty with copper has been the low vapor pressure of copper halides. This makes it difficult to pattern these materials.

Copper has been patterned using reactive ion etching ("RIE"), or damascene. Damascene etches grooves and vias into the dielectric and then deposits copper into the grooves. Chemical vapor deposition ("CVD"), however, has been used to provide a good filling for both the grooves and vias. CVD forms a vapor deposit on a reactive precursor. CVD of copper requires special equipment and expensive precursors. This has limited the interest in copper CVD.

The present invention describes a technique which allows copper to be deposited to form vias and interconnects within desired areas without requiring the difficult CVD process. A physical vapor deposition (PVD), preferably sputtering, is used along with important materials selections and techniques to allow selective deposition of the materials.

The present technique teaches selectively depositing copper metallization to fill vias and other high aspect ratio features. The technique according to the present invention uses selective sputtering and resputtering during the physical vapor deposition. The sputtered areas collect copper and hence build up a layer of copper in those areas. The resputtered areas have a steady state copper overcovering, which forms a thinner layer, e.g., a monolayer, over those resputtered areas. Importantly, this thinner layer increases in thickness more slowly than the sputtered, thicker layer.

An etchback step, for example chemical-mechanical polishing, can then be used to remove the thinner layer, while leaving most of the thicker layer intact within the filled feature.

The enhanced resputtering yield of a very thin film allows zero film growth on the underlayer film. However, the lower atomic weight underlayer in the via, made of a material such as TiN, Mo or transition metal silicide, allows the film thickness to increase.

BRIEF DESCRIPTION OF THE DRAWINGS

These and other aspects of the invention will now be described in detail with reference to the accompanying drawings, wherein:

FIGS. 1A–1C show the selective copper sputtering techniques used to fill vias;

FIGS. 2A–2C show the selective copper sputtering technique used to form lines.

DESCRIPTION OF THE PREFERRED EMBODIMENTS

Figure 3A:
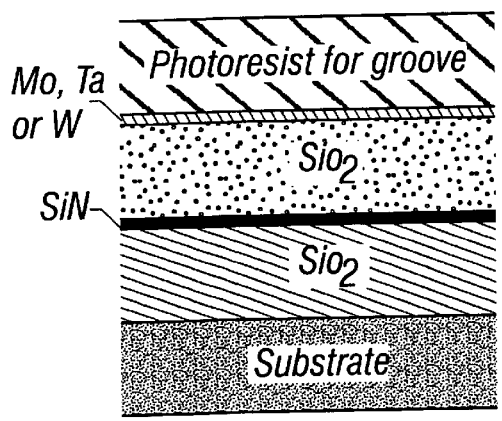
FIGS. 3A–3F show an alternative embodiment in which sidewalls are coated.

The present invention uses both sputtering and resputtering.

Sputtering uses a technique of eroding materials from a "target" and forcing those materials to erode towards a substrate on which deposition of those materials is desired. Sputtering builds up the material on the substrate.

Resputtering, on the other hand, uses the incoming materials to knock out some of the materials of the substrate. The resputtering yield represents the fraction of surface materials that are knocked out by the incoming materials. An enhanced resputtering yield knocks out as many materials as are deposited. This produces a fixed thickness layer, preferably a monolayer, of the deposited material.

The selective deposition of the present invention is done by using a PVD sputtering technique. One portion of the material is deposited over a light molecular weight material. The light material has minimal resputtering, so the sputtered material accumulates on the light molecular weight material. Other portions, where accumulation is not desired, uses a heavy molecular weight underlayer. At these heavier weight locations, enhanced resputtering is carried out, so that the sputtered material is formed on the surface, but does not accumulate on the surface.

More generally, the criteria for selective deposition, with the preferred material copper (Cu) include:

(1) that the resputtering yield of a thin Cu film on a heavy underlayer exceeds the sputtering yield of the Cu itself, and (2) the deposition rate of Cu exceeds the Cu sputtering yield but not the resputtering yield of the thin copper film on the underlayer.

The preferred technique according to the present invention uses a selective deposition which obeys the relation $$M_f < M_i < M_{ul}$$

where $M_f$, $M_i$, and $M_{ul}$ are respectively the atomic weights of the film, sputtering ion and underlayer.

Selective deposition based on enhanced resputtering yield has been demonstrated experimentally for aluminum on tungsten, aluminum-3% copper alloys on tungsten, and titanium on platinum. The inventors of the present invention are believed to be the first to conceive of patterning copper using a high atomic weight overlayer for enhanced resputtering techniques. Selective deposition via enhanced resputtering yield ("ERY") of copper at 63.5 amu presents a unique challenge as compared with resputtering aluminum at 26.9 amu. Specifically, the preferred relation $M_f < M_i < M_{ul}$ is not fulfilled if argon at 40 amu is used as a sputtering ion.

Hence, the present invention preferably uses Kr ions and DC-biased magnetron sputtering to fulfill the relation. The ERY selective growth process is controlled by using the ratio between the film deposition rate and the resputtering rate to control the amount of deposition. Preferably the ratio is controlled to allow deposition of the desired thickness of copper in the desired area, with no more than a few molecular layers of copper being deposited in the other areas. Less preferable, but still acceptable, is to deposit any amount more copper in the desired area than is deposited in the undesired area.

FIGS. 1A through 1C show a structure fabricated using the enhanced resputtering of copper in vias. Substrate 100 is covered with a lower level metal 102. A lightweight material which will not enhance sputtering is deposited over the lower level metal. This embodiment uses TiN layer 104 to cover that lower level metal 102.

Layer 104 is covered with a dielectric layer of $SiO_2$ 106. A heavy weight resputtering covering layer 110, preferably formed of either Mo, Ta or W is used in the area where the copper will not eventually be needed. A photoresist 112 for the vias is then formed. The photoresist is used to form the via area 114, and then the photoresist is removed using conventional techniques. This leaves the lower weight material 104 in the bottom of the via area where it will be sputtered, and the higher weight material 110 at the top surface where it will cause enhanced resputtering.

Copper is then sputtered over the whole area, to collect within the via. Enhanced resputtering causes a thinner layer 118 of copper to be formed, i.e., without collection of a thick layer of the copper. The well 114 is filled with a thick layer of copper.

An alternative technique shown in FIGS. 2A–2C forms lines instead of vias. The structures are similar to those shown in FIG. 1, however a silicon nitride (SiN) layer 200 is used at the bottom of the grooves in order to form the lightweight barrier layer which does not cause resputtering.

The end products in both FIGS. 1C and 2C each preferably use a final etchback step in order to remove the thin layer formed by the resputtering. The etchback can remove the top thin copper layer 118, as well as some part of the heavy material layer 110.

Figure 3B:
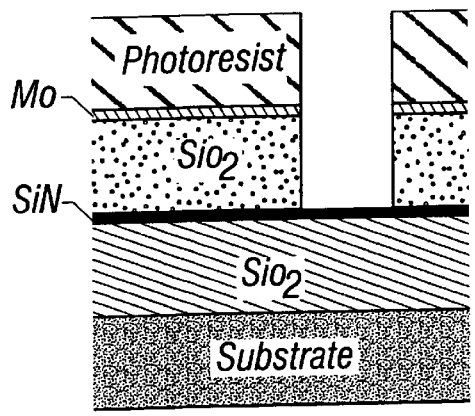
Figure 3C:
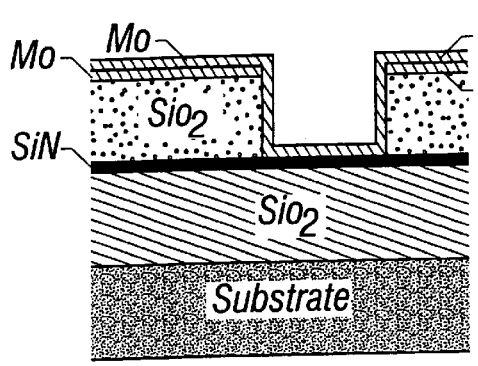
Figure 3D:
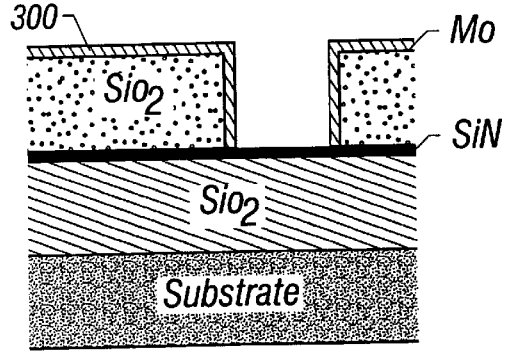
Figure 3E:
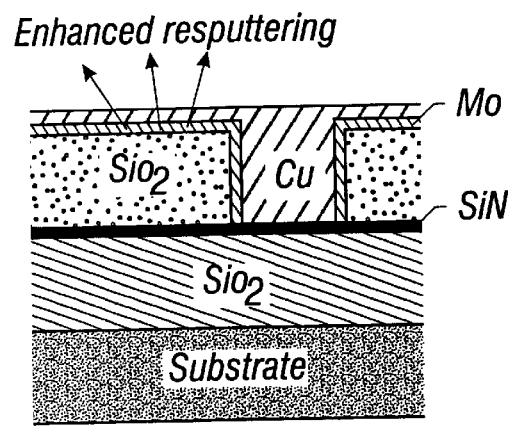
Figure 3F:
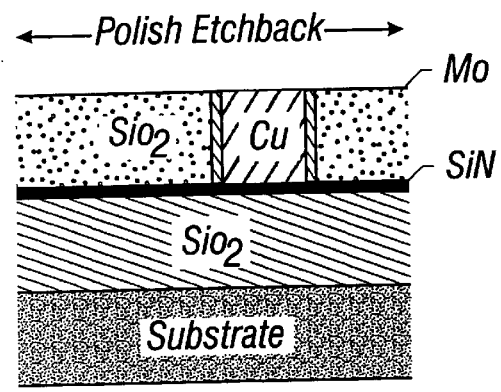

An alternative embodiment is shown in FIGS. 3A–3F. In some circumstances it is believed that copper might diffuse into the sidewalls of the feature being filled. The present embodiment lines the sidewalls to prevent that possible effect and for other enhanced effects.

In this embodiment, the sidewalls are covered with layers of heavy weight material, here Mo 300, 302. A first layer 302 is anisotropically etched away to leave a Mo barrier layer 300 covering the sidewalls but not the bottom. The bottom of the via is still preferably formed of SiN. Selective sputtering is then used as described above and shown in FIG. 3e to deposit a thick layer of copper within the groove, and a thin layer outside the groove. This is followed by a polished etchback step shown in FIG. 3f. This leaves a small amount of Mo on the surface, and a thick copper feature.

Although only a few embodiments have been described in detail above, those having ordinary skill in the art will certainly understand that many modifications are possible in the preferred embodiment without departing from the teachings thereof.

For example, features other than lines and vias could easily be formed. Any patterned feature can be formed using the techniques of the present invention.

Materials other than copper can also be used, and any material which can be used for both resputtering and sputtering onto different materials is suitable.

All such modifications are intended to be encompassed within the following claims.

What is claimed is:

1. A method of selectively forming a feature of a material on a substrate, where the material is capable of being both sputtered and resputtered, comprising:

forming a underlayer film of a lower atomic weight over the substrate, said lower atomic weight being one which will allow sputtering of a material without significant resputtering, the material otherwise capable of both sputtering and resputtering;

depositing a dielectric layer over at least a portion of said low atomic weight film;

depositing an overlayer over said dielectric layer, said overlayer being of a higher atomic weight material having a weight that will enhance resputtering for the material, said overlayer being deposited only in areas where accumulation of said material is not desired;

using a physical deposition process to deposit a material onto said areas of said lower atomic weight underlayer and onto said higher atomic weight overlayer, said physical deposition process accumulating the material on said lower atomic weight underlayer, and forming a thinner layer of the material over said higher atomic weight overlayer; and removing at least the thinner layer formed over said overlayer film.

2. A method as in claim 1, wherein said desired material is copper.

3. A method as in claim 2, wherein said overlayer film is one of Mo, Ta or W.

4. A method as in claim 2, wherein said underlayer film is SiN or TiN.

5. A method as in claim 2 wherein said physical deposition process is carried out according to the equation $M_f < M_i < M_{ul}$ wherein $M_f$ is the atomic weight of the film, $M_i$ is the atomic weight of the sputtering ion, and $M_{ul}$ is the atomic weight of the underlayer.

6. A method as in claim 4 wherein said sputtering is carried out using Kr ions.

7. A method as in claim 2 further comprising depositing sidewall barriers into sidewall areas of said desired material that is accumulated.

8. A method as in claim 2, wherein said depositing a dielectric layer comprises:

forming the dielectric layer;

forming a photoresist over the dielectric layer;

etching a desired feature into said dielectric layer using said photoresist; and removing said photoresist to leave the dielectric layer with the desired feature remaining therein, wherein said physical deposition process accumulates the copper within the desired feature.

9. A method of forming a feature of a copper material comprising:

forming a substrate;

forming a lower level material on the substrate;

forming a dielectric with a first area to be filled with a feature over said lower level material;

covering second areas of said dielectric, other than said first area, with a resputtering layer material; and releasing copper material to said first and second areas using a physical deposition technique to sputter and accumulate on said lower level material, and to resputter and not accumulate on said resputtering layer material.

10. A method as in claim 9, wherein said resputtering is carried out such that the atomic weight of copper is less than the atomic weight of a sputtering ion used in said resputtering which is less than an atomic weight of said underlayer.

11. A method as in claim 9 wherein said sputtering ion is krypton.

12. A method of forming a copper feature, comprising:

forming a first material and a second material, said first material being one which, during physical deposition of a copper-containing material will collect said copper-containing material, and said second material being one which, during physical deposition of copper-containing material, will collect less copper-containing material than said first material;

depositing copper-containing material onto said first and second materials to thereby form a thicker layer of copper-containing material on said first material than on said second material.

13. A method as in claim 12, further comprising removing a thickness of said copper-containing material, to remove said copper-containing material on said second material while leaving said copper-containing material on said first material.

* * * * *